United States Patent

Baba

(10) Patent No.: US 9,894,015 B2
(45) Date of Patent: Feb. 13, 2018

(54) COMMUNICATION APPARATUS AND COMMUNICATION SYSTEM

(71) Applicant: ALAXALA NETWORKS CORPORATION, Kawasaki-shi, Kanagawa (JP)

(72) Inventor: Junji Baba, Kawasaki (JP)

(73) Assignee: Alaxala Networks Corporation, Kanagawa (JP)

( * ) Notice: Subject to any disclaimer, the term of this patent is extended or adjusted under 35 U.S.C. 154(b) by 225 days.

(21) Appl. No.: 14/777,542

(22) PCT Filed: Aug. 6, 2014

(86) PCT No.: PCT/JP2014/070667
§ 371 (c)(1),
(2) Date: Sep. 16, 2015

(87) PCT Pub. No.: WO2015/033726
PCT Pub. Date: Mar. 12, 2015

(65) Prior Publication Data
US 2016/0294733 A1    Oct. 6, 2016

(30) Foreign Application Priority Data

Sep. 6, 2013    (JP) ................. 2013-184589

(51) Int. Cl.
*H04L 12/931* (2013.01)
*H05K 7/20* (2006.01)

(52) U.S. Cl.
CPC ............ *H04L 49/40* (2013.01); *H05K 7/207* (2013.01); *H05K 7/20572* (2013.01)

(58) Field of Classification Search
None
See application file for complete search history.

(56) References Cited

U.S. PATENT DOCUMENTS

| 2005/0117310 | A1  | 6/2005 | Miyamoto et al. |
| 2012/0045204 | A1* | 2/2012 | Beshai ............ H04J 14/0284 398/45 |

(Continued)

FOREIGN PATENT DOCUMENTS

| JP | 05-145573 A  | 6/1993 |
| JP | 2005-166100 A | 6/2005 |

(Continued)

OTHER PUBLICATIONS

Japanese Office Action received in corresponding Japanese Application No. 2015-535394 dated Apr. 12, 2016.
International Search Report of PCT/JP2014/070667.

*Primary Examiner* — Huy D Vu
*Assistant Examiner* — Hong Shao
(74) *Attorney, Agent, or Firm* — Mattingly & Malur, PC

(57) ABSTRACT

The communication apparatus includes: a first circuit board unit including, on a front surface of the communication apparatus, a port for transmitting and receiving data to and from the network; a second circuit board unit including a plurality of first connectors connected to at least one of the first circuit board units, a second connector being capable of accommodating at least a bandwidth accommodated by the plurality of first circuit board units, and being connected, via a cable, to the other communication apparatus of a standby system; and a cross bar switch for selectively outputting data to the first connectors or the second connector as a data output destination, and a ventilation control unit for controlling a flow of air flowing between each of the first circuit board unit and the second circuit board unit, and outside of the communication apparatus.

9 Claims, 16 Drawing Sheets

(56) References Cited

U.S. PATENT DOCUMENTS

| | | |
|---|---|---|
| 2013/0107452 A1 | 5/2013 | Qu |
| 2013/0235524 A1* | 9/2013 | Baba .................... H05K 7/1452 361/695 |
| 2013/0322458 A1* | 12/2013 | Nagumo ................. H04L 45/28 370/401 |
| 2013/0329364 A1 | 12/2013 | Kameno et al. |

FOREIGN PATENT DOCUMENTS

| | | |
|---|---|---|
| JP | 2007-295409 A | 11/2007 |
| JP | 2011-146450 A | 7/2011 |
| JP | 2013-254450 A | 12/2013 |
| WO | 2012/102170 A1 | 8/2012 |

* cited by examiner

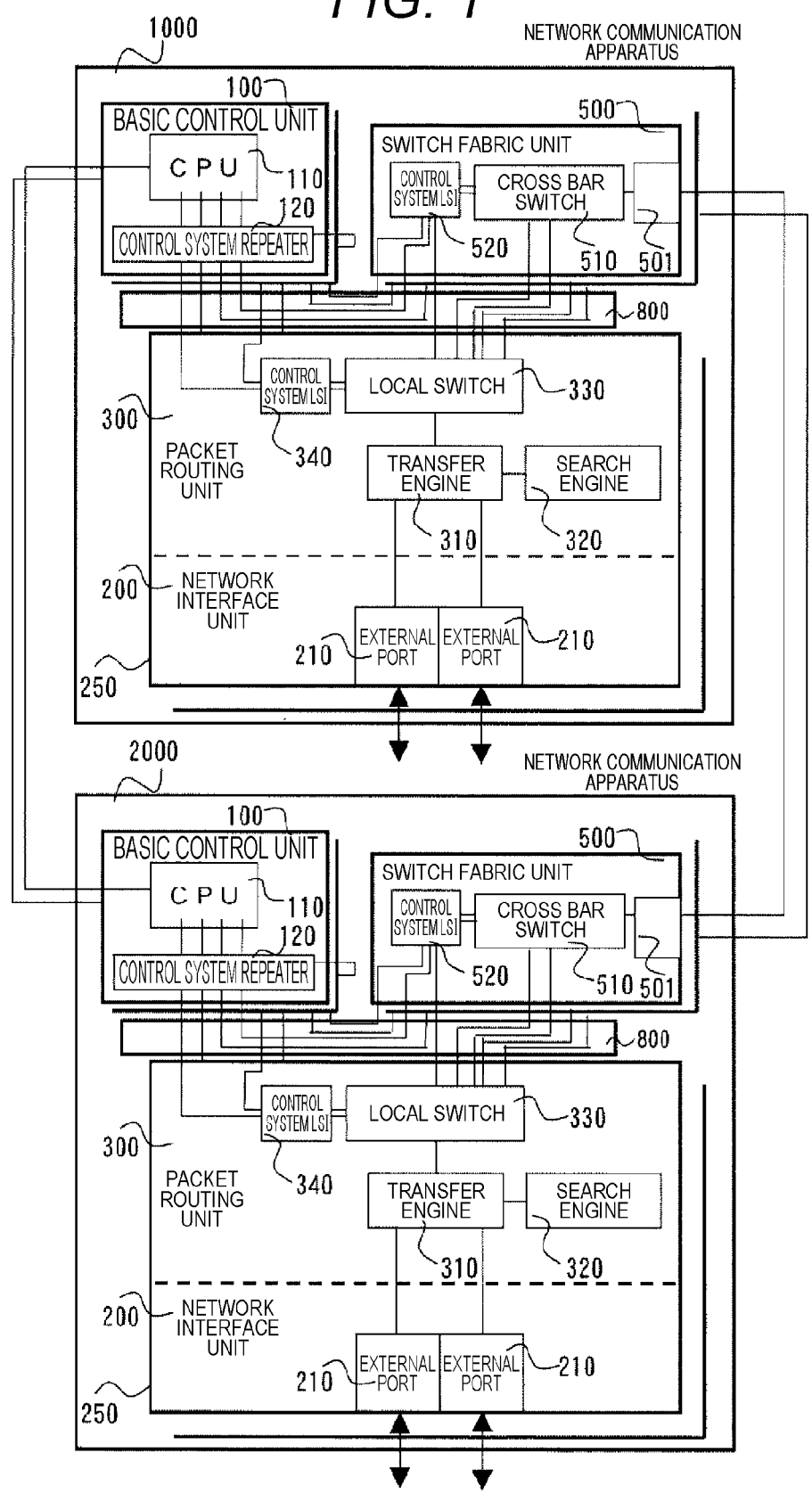

FIG. 13
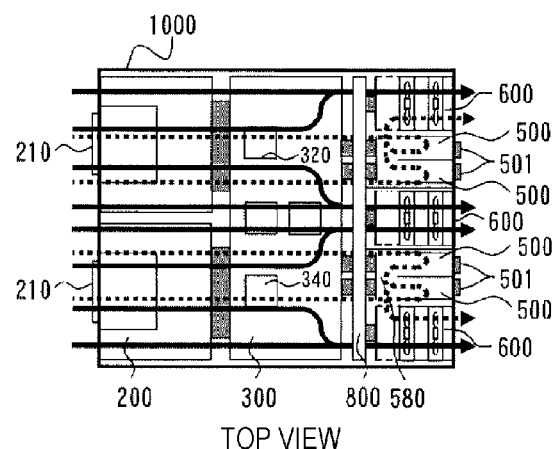
TOP VIEW
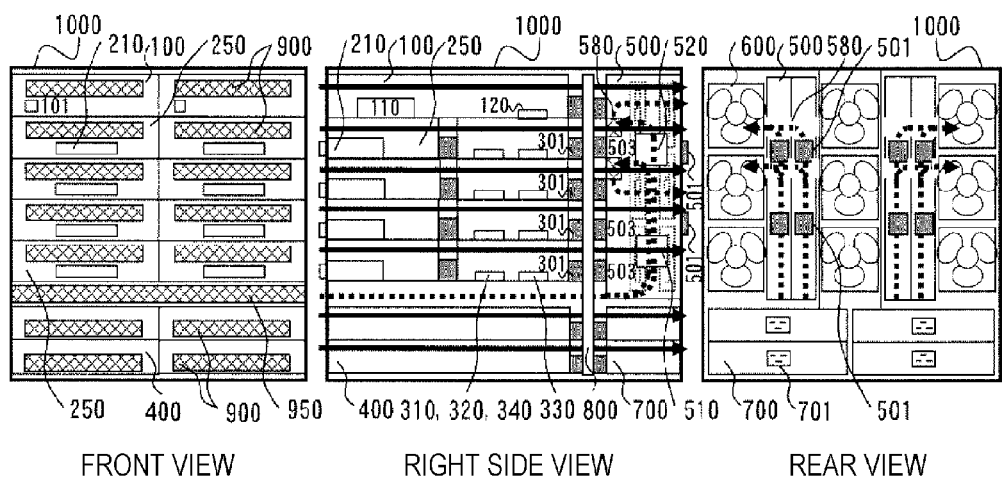
FRONT VIEW   RIGHT SIDE VIEW   REAR VIEW

TOP VIEW

FRONT VIEW

COMMUNICATION APPARATUS AND COMMUNICATION SYSTEM

TECHNICAL FIELD

The present invention relates to a communication apparatus or a communication system for transferring data, and particularly to a communication apparatus or a communication system for providing a redundant configuration to the outside.

BACKGROUND ART

Recently, along with the progress in the broadbandization of services, an amount of internet traffic has been on the rise. There has been steadily increasing demand for speed up/wider bandwidth of a communication apparatus.

If any trouble should occur in a network system, and a network should stop even for a short time, many works would be interrupted. Thus, it has become increasingly likely to generate heavy loss in the event of such a trouble.

A conventional virtualization/redundancy technique is disclosed in PTL 1.

PTL 1 discloses establishing non-blocking connection between transfer engines of respective apparatuses, connecting between a plurality of control planes by providing control system repeaters, and controlling data planes across all apparatuses from an operational system control plane.

PTL 2 discloses a cooling system configured to cool a circuit board assembly in an orthogonal architecture arranged inside a cabinet. The cooling system includes a first cooling air duct that allows air to flow from the front area of the cabinet corresponding to the region of the circuit board assembly into the cabinet and flow through the front portion of the circuit board assembly, then be distributed into two lateral sides of the circuit board assembly, and be discharged out of the cabinet, and a second cooling air duct that allows air to flow from the front area of the cabinet corresponding to one end of the circuit board assembly into the cabinet and through the rear portion of the circuit board assembly, and then be discharged out of the cabinet.

CITATION LIST

Patent Literatures

PTL 1: WO 2012/102170 A
PTL 2: US 2013/0107452 A
PTL 3: US 2013/0329364 A

SUMMARY OF INVENTION

Technical Problem

PTL 1 employs a method of establishing "non-blocking" connection between two apparatuses, connecting between control planes of the two apparatuses by providing control system repeaters, and thereby achieving data planes all looking uniform from an operational system control plane. This eliminates protocol exchange between control planes, and realizes simplification of control and deterioration prevention of setting performance. In addition, here, the "non-blocking" is defined as meaning that connection that enables communication between apparatuses with a bandwidth equal to or greater than a total bandwidth of external ports included in communication apparatuses is established. In contrast, "blocking" refers to a case in which connection that enables communication with a bandwidth equal to or greater than a total bandwidth of external ports included in the communication apparatuses is not established.

At this time, in order to establish non-blocking connection between a plurality of apparatuses, a resource equivalent to a resource occupied by external ports of network interfaces (line transmission and reception) for transmitting and receiving data for normal data relay, i.e., a connection area needs to be secured anywhere within the apparatus, and a connector needs to be arranged.

Nevertheless, in an actual communication apparatus, network interfaces are closely mounted on the apparatus front surface, and a cooling fan, a power receiving unit (power cable connection unit), and the like are closely mounted on the apparatus rear surface. Thus, an area for establishing non-blocking connection by connecting between a plurality of apparatuses by normal external ports cannot be secured.

In recent years, with a view to conforming to the Network Equipment Building System (NEBS), which is a standard of communication devices for telecommunications carriers, employing a front-rear air intake and exhaust cooling structure as a cooling structure of a communication apparatus has been increasingly demanded. Thus, the electric device of PTL 1 does not conform to the NEBS.

PTL 3 discloses a structure of a casing that realizes a front-rear air intake and exhaust cooling structure.

In electric devices of PTLS 1, 2, and 3, cables for electrically or optically connecting between circuit board units are arranged on the backplane rear surface. Accordingly, there arises such a problem that the cables block a ventilation opening and interfere with passage of cooling air.

The present invention has been contrived for solving at least one of the problems, and provides an apparatus having cable layout not affected by signal transmission of a cable.

Solution to Problem

A communication apparatus according to an aspect of the present disclosure is a communication apparatus of an operational system for providing a redundant configuration to outside with another communication apparatus of a standby system, and for relaying data between information terminals via a network. The communication apparatus includes: a first circuit board unit including, on a front surface of the communication apparatus, a port for transmitting and receiving data to and from the network; a second circuit board unit including a plurality of first connectors connected to at least one of the first circuit board units, a second connector being capable of accommodating at least a bandwidth accommodated by the plurality of first circuit board units, and being connected, via a cable, to the other communication apparatus of a standby system, and a cross bar switch for selectively outputting data to the first connectors or the second connector as a data output destination; and a ventilation control unit for controlling a flow of air flowing between each of the first circuit board unit and the second circuit board unit, and outside of the communication apparatus. The communication apparatus is connected to the second connector, and a cable connected to another communication apparatus of a standby system is arranged at a position where a flow of air controlled by the ventilation control unit is not hampered.

Furthermore, as an aspect of the present invention, in the communication apparatus, the first circuit board unit includes a first ventilation opening for passing air to and from outside, on a same front surface side as the port. The ventilation control unit includes, on a rear surface side of the apparatus, a FAN for controlling a flow of the air, and a second ventilation opening for passing air to and from outside of the communication apparatus. The communication apparatus is connected, via the cable, with a communication apparatus of a standby system arranged in at least one direction of upper and lower directions of the communication apparatus in such a manner that ventilation by the second ventilation opening is not hampered.

Furthermore, as an aspect of the present invention, in the communication apparatus, the plurality of first circuit board units is vertically arranged on a front surface side of the communication apparatus with a third circuit board unit being interposed therebetween, and a plurality of second circuit board units is horizontally arranged on a rear surface side of the communication apparatus. The second ventilation opening is arranged next to the second circuit board unit in a horizontal direction.

Advantageous Effects of Invention

According to an aspect of the invention, there is provided a communication system taking a redundant configuration by a communication apparatus having a cooling structured not affected by data transfer of a data plane.

BRIEF DESCRIPTION OF DRAWINGS

FIG. 1 is a diagram illustrating a virtualization/redundancy configuration of a communication apparatus to which the present example is applied.

FIG. 13 is a diagram illustrating a top surface/front surface/right side surface/rear surface of a communication apparatus to which the present example is applied.

DESCRIPTION OF EMBODIMENTS

A. Example

Figure 2A:
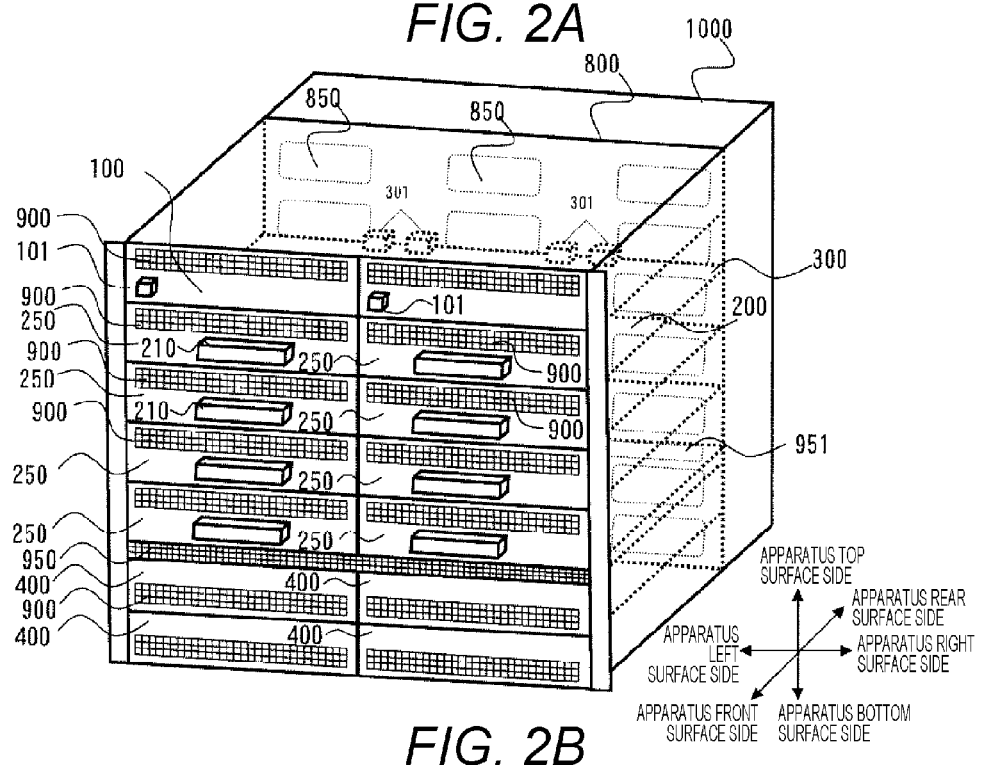
FIGS. 2A and 2B are a front external view and a rear external view, respectively, of a casing according to the present example.

Hereinafter, an embodiment of the present invention will be described in detail with reference to FIGS. 1 to 4. First, a function and a configuration of a network apparatus to which the present example is applied will be described with reference to FIG. 1.

FIG. 1 is a diagram illustrating a virtualization/redundancy configuration of a communication apparatus to which the present example is applied. FIG. 1 illustrates a configuration in which non-blocking connection is established between two communication apparatuses 1000 and 2000 via respective switch fabric units 500. As described above, the non-blocking connection means connecting between the communication apparatuses 1000 and 2000 with a bandwidth equal to or greater than a total bandwidth of external ports included in each apparatus.

In addition, respective basic control units 100 of the two communication apparatuses 1000 and 2000 are connected for transmission and reception of a control signal. For example, if the communication apparatus 1000 is assumed to be an operational system apparatus, routing information learned by a central processing unit (CPU) 110 of the apparatus is set in a CPU 110 of the communication apparatus 2000 serving as a standby system apparatus. In addition, the operational system apparatus and the standby system apparatus may be in a relationship opposite to that in the above-described example.

An apparatus configuration of the communication apparatus 1000 will now be described. The communication apparatus 2000 also has a similar configuration. The communication apparatus 1000 includes the basic control unit 100, the switch fabric unit 500, a backplane 800, a packet routing unit 300, and a data plane 250 including a network interface unit 200.

The basic control unit 100 is a circuit board unit including the CPU 110 and a control system repeater 120. The CPU 110 is a processor for monitoring other circuit board units and for executing a control program, and is connected to the control system repeater. The control system repeater 120 distributes control signals by the CPU 110 to other circuit board units, and transfers control signals to the switch fabric unit 500 and the data plane 250 via signal lines.

The switch fabric unit 500 includes, on the board surface, a cross bar switch 510, a control system large scale integration (LSI) 520, and a connector 501 connected to cables laid outside the apparatus.

The backplane 800 is a circuit board unit including, on the board surface, transmission lines with a plurality of connectors that are for transmitting signals between these connectors.

The data plane 250 is a circuit board unit including, on the board surface, the packet routing unit 300 and the network interface unit 200.

Next, a flow of a packet process performed in the communication apparatus will be briefly described. When a packet from the outside reaches the network interface unit 200, the packet is transferred, via an external port 210, to a transfer engine 310 installed on the packet routing unit 300. The transfer engine 310 extracts header information within the packet, and transmits the extracted header information to a search engine 320. The search engine 320 refers to various tables based on the received header information to obtain information necessary for packet transfer control. Examples of the information necessary for packet transfer control include routing information and filter/Quality of Service (QoS) information. These kinds of information are returned to the transfer engine 310.

Based on the information obtained from the search engine 320, the transfer engine 310 designates an input/output port to which the packet is to be transferred, and transfers the packet to a local switch 330 and the cross bar switch 510 included in the switch fabric unit 500. Furthermore, the cross bar switch 510 transfers the packet to a corresponding packet routing unit 300, and the packet is transferred from the local switch 330 to the transfer engine 310.

The transfer engine 310 extracts header information within the received packet, and transmits the extracted header information to the search engine 320. Based on the received header information, the search engine 320 establishes association between an internet protocol (IP) address and a media access control (MAC) address, i.e., so-called address resolution, to obtain a MAC address. This result is returned to the transfer engine 310, and the packet is transferred to the outside from a network interface unit 200 having an identified external port 210.

In FIG. 1, non-blocking connection is established between the communication apparatuses 1000 and 2000. Thus, all data planes including an operational system/standby system look uniform from an operational system control plane, and routing control can be uniformly set. This can eliminate complicated protocol exchange between control planes, and the communication apparatuses function as a single virtual apparatus including the doubled number of external ports.

Figure 2B:
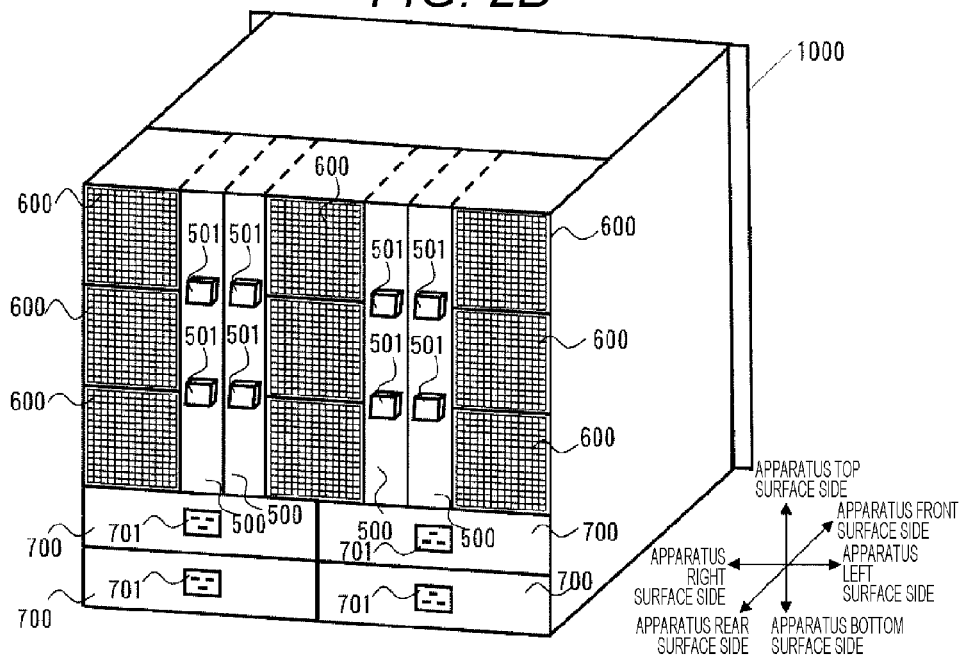

FIGS. 2A and 2B are a front external view (FIG. 2A) and a rear external view (FIG. 2B) of a casing according to the present example. In FIGS. 2A and 2B, an apparatus left surface side and an apparatus right surface side respectively indicate left and right surfaces viewed from an apparatus front surface. In the subsequent drawings, the apparatus left surface side and the apparatus right surface side indicate a similar positional relationship. On the apparatus front surface (FIG. 2A), the communication apparatus 1000 includes the basic control unit 100, data planes 250, and front power supply units 400 that are arranged in a perpendicular direction (vertical direction) from top. In the data plane 250, the network interface unit 200 is arranged on the apparatus front surface, and the packet routing unit 300 is arranged in a rear surface direction.

The basic control unit 100 includes a connection unit 101 for transmitting and receiving control signals to and from a plurality of communication apparatuses. The network interface unit 200 includes external ports 210 connecting to outside networks. The packet routing unit 300 includes backplane connectors 301 connecting to switch fabric units 500 mounted from the apparatus rear surface. Units mounted from the apparatus front surface may be each provided with a ventilation opening 900 for letting therethrough cooling air for cooling components mounted on each unit. Similarly, the backplane 800 may be provided with ventilation openings 850 for letting cooling air therethrough.

On the apparatus rear surface side (refer to FIG. 2B), the switch fabric units 500, FAN units 600, and power receiving units 700 are arranged. The switch fabric units 500 include connection units 501 for establishing non-blocking connection with a plurality of communication apparatuses. The power receiving units 700 each include a connection unit 701 for connecting a power cable. A commercial power supply of 100V or 200V is generally used in the communication apparatus.

Each unit is connected to the basic control unit 100 via the backplane 800 to be controlled.

The switch fabric units 500 and the FAN units 600 are arranged in a left-right direction (horizontal direction) viewed from the rear surface side of the casing of the communication apparatus 1000.

A circuit board unit of the switch fabric unit 500, a circuit board unit of the data plane 250, and a board of the backplane 800 are perpendicular to one another on the board surface.

The FAN unit 600 includes an exhaust opening for letting air therethrough. Alternatively, the FAN unit controls the flow of air inside the apparatus, and air taken from the ventilation opening 900 is exhausted from the exhaust opening, thereby realizing a front-rear air intake and exhaust structure inside the communication apparatus.

In addition, the switch fabric units 500 are perpendicular to the backplane 800 on the board surface, but may not be necessarily perpendicular to the board surface of the data plane 250, and may be parallel thereto.

Figure 3:
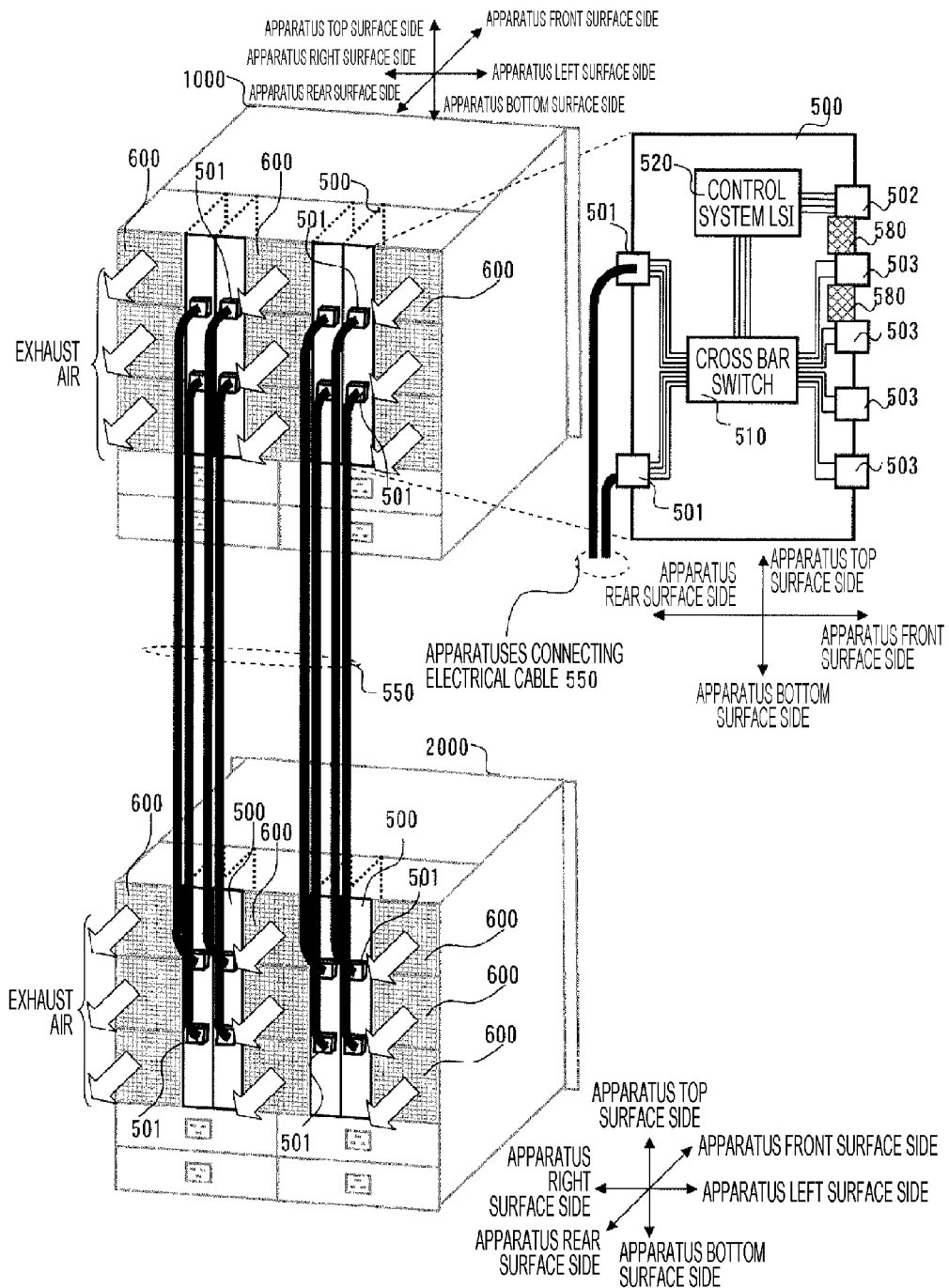
FIG. 3 is a diagram illustrating a configuration of connection between apparatuses according to an example of the present invention.

FIG. 3 is a diagram illustrating a configuration of a communication system. The communication system includes the communication apparatus 1000 and 2000 connected via apparatuses connecting electrical cables 550. In each communication apparatus 1000 (2000), the switch fabric units 500 are mounted from the apparatus rear surface. The switch fabric units 500 each include the cross bar switch 510 and the control system LSI 520 as described with reference to FIG. 1. The cross bar switch 510 and the control system LSI 520 are connected via a signal line. In addition, the switch fabric units 500 each include a connector 502 connected to the backplane 800. The connector 502 is connected to a connector on the backplane side. Transmission and reception of a signal of a control plane are executed via the connector 502 and the control LSI 520. In addition, the switch fabric units 500 include the connectors 501 connected to the apparatuses connecting electrical cables 550. A signal of a data plane is transmitted and received inside each apparatus via a plurality of connectors 503 on the apparatus front surface side. A signal of a data plane is transmitted and received between the communication apparatuses from the plurality of connectors 501 on the apparatus rear surface side via the apparatuses connecting electrical cables 550, by non-blocking connection. Since non-blocking connection is established between the two communication apparatuses, all data planes look uniform from an operational system control plane, and protocol exchange between control planes can be eliminated. This can simplify control and prevent deterioration of setting performance.

In addition, the switch fabric units 500 are provided with board cutouts 580. The board cutouts 580 are ventilation openings for letting cooling air, which flows from a ventilation opening 950 into the switch fabric units 500, flow to the FAN units 600, so as to cool the switch fabric units 500. This cooling method will be described in detail with reference to FIG. 13. In addition, the board cutouts 580 are similarly illustrated in FIGS. 6, 7, and 10, but the mechanisms thereof are for the same purpose as that in FIG. 3. Thus, hereinafter, the descriptions thereof will be omitted.

When two communication apparatuses, i.e., an operational system apparatus and a standby system apparatus, are connected via a cable, placing the two apparatuses on a top and a bottom of a rack and vertically connecting the apparatuses via the cable reduces an installation area in a station building. In the present example, when installing the apparatuses on a rack in this manner, the cables vertically laid out by the connectors 501 do not block exhaust openings of the FAN units 600 and do not hamper air exhaust from the FAN units 600. Thus, in the present example, the flow of air flowing into and out of the apparatus is not hampered, so that cool performance does not degrade.

Furthermore, apparatuses connecting cables are laid in an apparatus rear surface area different from an apparatus front surface area in which the external ports 210 for many network interfaces (line transmission and reception) are closely arranged. With this structure, the danger of interference due to closely-arranged cables and the danger of a misoperation can be avoided.

Figure 4:
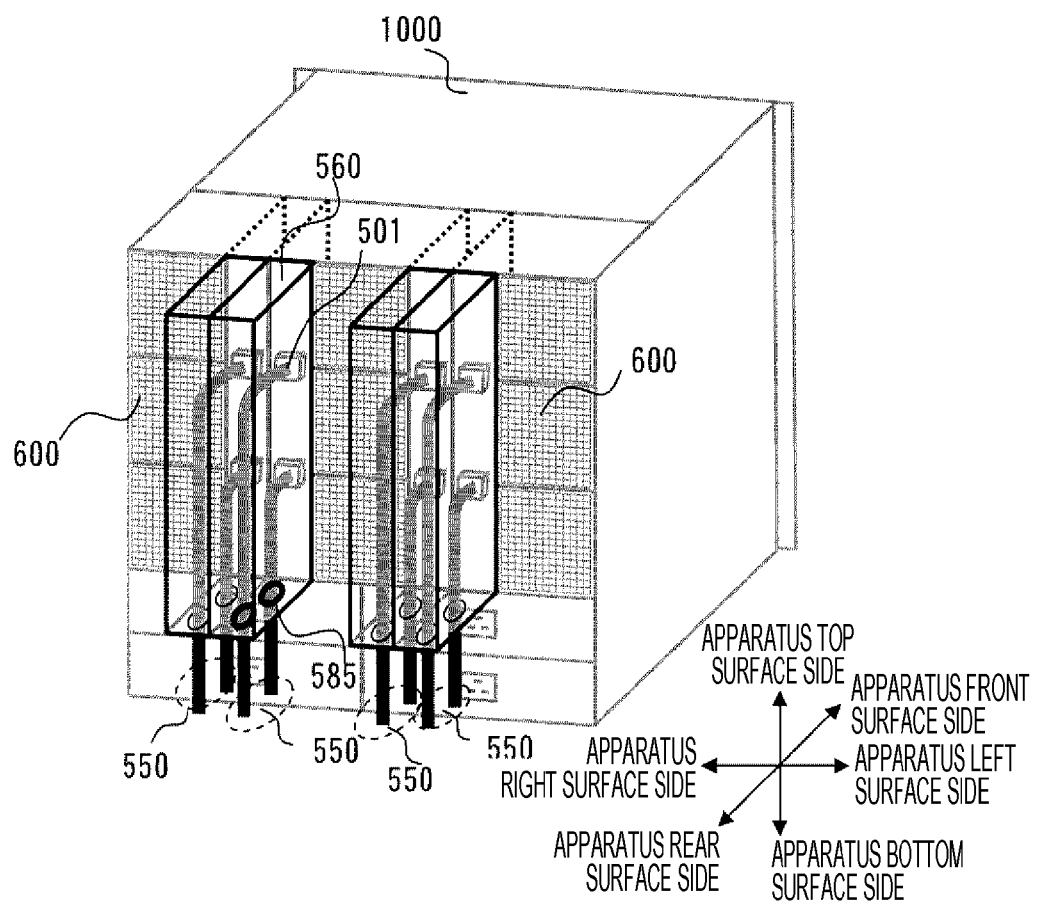
FIG. 4 is a diagram in which connection between apparatuses is formed by a cartridge according to an example of the present invention.

FIG. 4 illustrates an example in which one ends of the plurality of apparatuses connecting electrical cables 550 illustrated in FIG. 3 are formed by a cartridge 560. The cartridge is arranged on the rear surface of at least either one of the communication apparatuses 1000 and 2000.

Even if the cartridge 560 illustrated in FIG. 4 is added, the configuration of the communication system illustrated in FIG. 3 remains unchanged. The plurality of communication apparatuses are connected via the apparatuses connecting electrical cables 550 by surfaces (e.g., the rear surface sides) different from the surface sides on which signals of the data planes of the plurality of communication apparatuses are transmitted and received. The cartridge 560 has a polyhedron shape, but a connection point of the connector 501 and a connector on the cable side is provided with a space. In this space, the connector on the cable side inside the cartridge and the connector 501 are connected. In addition, in this case, the cartridge 560 is detachably attached to the switch fabric unit.

The cartridge 560 includes guide portions 585 (e.g., holes are provided in a cuboid) for guiding the apparatuses connecting electrical cables 550 for communicating with another communication apparatus 2000. By the cartridge 560, the apparatuses connecting electrical cables 550 and the connectors 501 of the communication apparatus 1000 or 2000 are connected. This can solve the trouble of a layout work of the apparatuses connecting electrical cables 550.

In addition, since the cartridge is provided, air flowing out from the exhaust openings of the FAN units 600 is shut out from the inside of the cartridge. The cartridge 560 functions as a cover for preventing the cables 550 from being affected by air flowing out from the exhaust openings. In addition, the cartridge 560 also functions as a guide for laying out cables connected to another communication apparatus 2000.

Furthermore, swinging of the apparatuses connecting electrical cables 550 inside the cartridge due to the exhaust of air flowing from the exhaust openings of the FAN unit 600 can be diminished. This improves connection reliability. In FIG. 4, the cartridge 560 having a cuboid shape is illustrated, but the shape of the cartridge 560 is not limited to cuboid.

As the connectors 501 on the apparatus rear surface side for connection with another apparatus that are illustrated in FIGS. 2 to 4, high density connectors similar to the connectors 503 used for data plane connection inside each apparatus are used. Such connectors are high density connectors having a bandwidth of about 400 Gbps in an area of 25 square millimeters, for example. By using cables with such high density connectors, non-blocking connection can be realized in a small space. As a result, apparatuses can be connected in such a manner that a total bandwidth of the connectors 501 included in the plurality of switch fabric units 500 and the apparatuses connecting electrical cables 550 becomes a bandwidth equal to or greater than a total bandwidth of external ports included in the network interface unit 200.

In this manner, since non-blocking connection is established between the two apparatuses, all data planes look uniform from an operational system control plane, and protocol exchange between control planes can be eliminated. This can simplify control and prevent deterioration of setting performance. In addition, since the non-blocking connection is realized on the apparatus rear surface side, a layout work of network interface cables closely laid on the apparatus front surface is not impeded.

In addition, the number of the mounted switch fabric units 500, the number of the connectors 501 mounted on the apparatus rear surface side, and the number of the connected apparatuses connecting electrical cables 550 that are illustrated in FIGS. 2 to 4 are not limited to the numbers in these drawings.

B. First Modified Example

Hereinafter, a first modified example of the present example will be described in detail.

Figure 5:
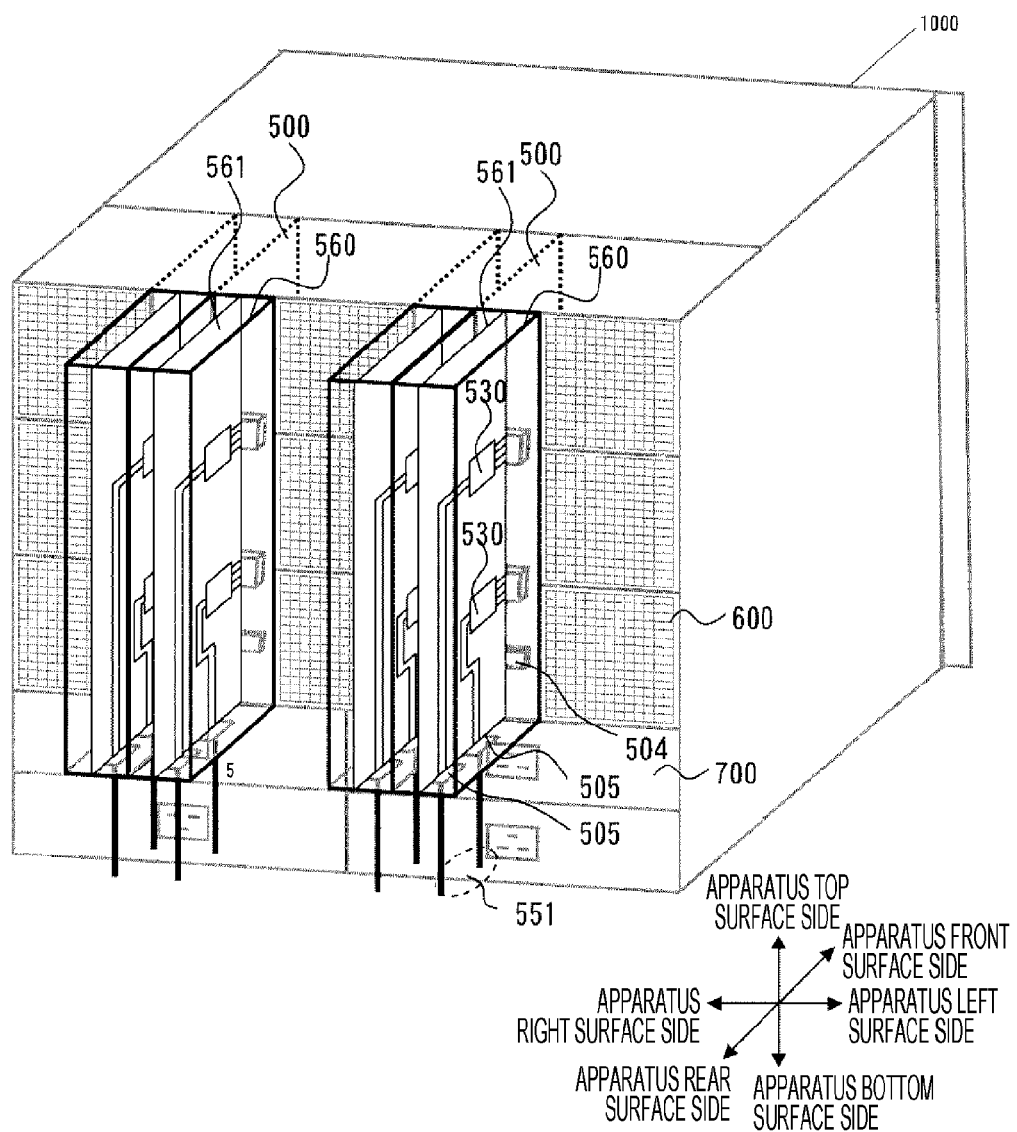
FIG. 5 is a diagram illustrating a first modified example.

FIG. 5 illustrates a modified example of the cartridge 560. The function/performance of apparatuses connection is similar to that in FIG. 4. The difference between the example in FIG. 5 and the example in FIG. 4 lies in that the cartridges 560 each include a board unit 561 on which connectors to be connected to the connectors 501 on the backplane side, speed conversion circuits 530, and connectors 505 for connecting apparatuses connecting electrical cables 551 to the cartridge 561 are arranged. The speed conversion circuit 530 is a semiconductor component having a function of converting a data rate. For example, the speed conversion circuit 530 is a semiconductor component having a function of converting data from the side of the switch fabric unit 500 having a 10 Gbps×10 lanes configuration, into 25 Gbps×4 lanes with a total bandwidth remaining the same, i.e., remaining at 100 Gbps. In this manner, by mounting the speed conversion circuit 530, the number of lanes can be reduced, and the number of the connected apparatuses connecting electrical cables 551 can be reduced. In addition, the board unit 561 may additionally include a power supply connector 504 for supplying power to the speed conversion circuit 530. With the configuration illustrated in FIG. 5, cables inside the cartridge are connected from the rear surface of the communication apparatus 1000 (2000), so that non-blocking connection is established between the two apparatuses. In addition, by providing the cartridges, swinging of the apparatuses connecting electrical cables 551 due to air flowing from the exhaust openings of the FAN units 600 can be diminished. This brings about a secondary effect of contributing to improvement in connection reliability. In addition, the speed conversion circuit 530 may be mounted inside the cartridge 561, or the speed conversion circuit 530 may be mounted inside the switch fabric unit 500.

Figure 6:
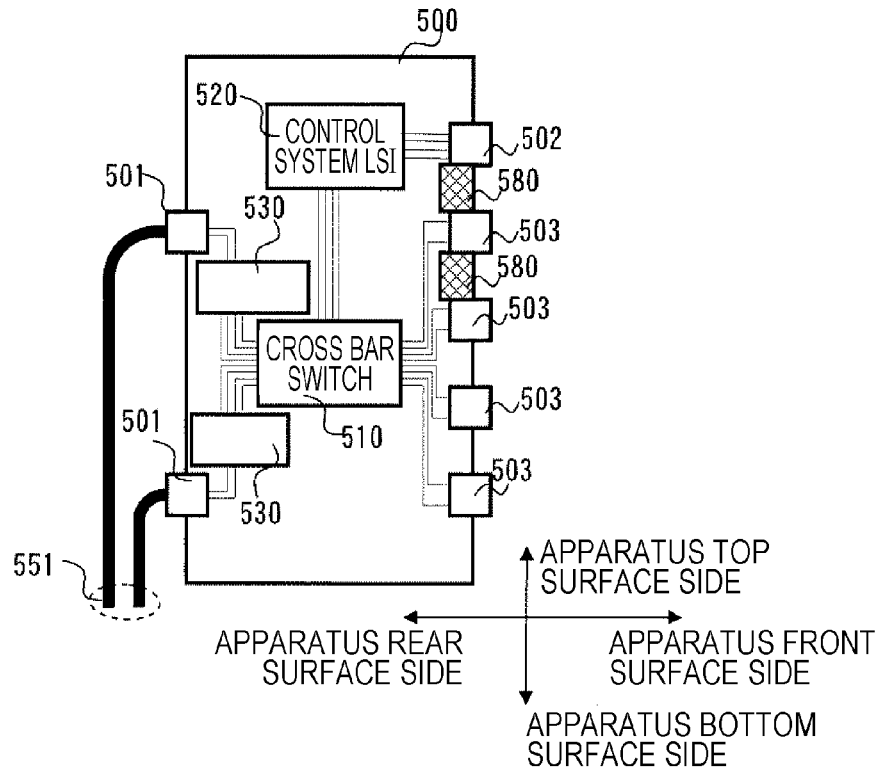
FIG. 6 is a diagram illustrating a configuration including a speed conversion circuit inside a switch fabric unit according to the first modified example.

FIG. 6 is a configuration diagram including the speed conversion circuits 530 inside the switch fabric unit 500. The switch fabric unit 500 is mounted from the communication apparatus rear surface. The switch fabric unit 500 includes the cross bar switch 510, the control system LSI 520, and the speed conversion circuits 530. The switch fabric unit 500 further includes, on the apparatus front surface side, the connector 502 for a control plane and the plurality of connectors 503 for data planes, and includes, on the apparatus rear surface side, the plurality of connectors 501 for connecting between apparatuses, and the plurality of apparatuses connecting electrical cables 551. Similar to that in FIG. 5, the speed conversion circuit 530 is a semiconductor component having a function of converting a data rate. For example, the speed conversion circuit 530 is a semiconductor component having a function of converting data from the data plane 250 via the backplane 800 having a 10 Gbps×10 lanes configuration, into 25 Gbps×4 lanes with a total bandwidth remaining the same, i.e., remaining at 100 Gbps. In this manner, by mounting the speed conversion circuit 530, the number of lanes can be reduced, and the number of the connected apparatuses connecting electrical cables 551 can be reduced.

C. Second Modified Example

Hereinafter, a second modified example of the present example will be described in detail with reference to FIGS. 7 and 8.

Figure 7:
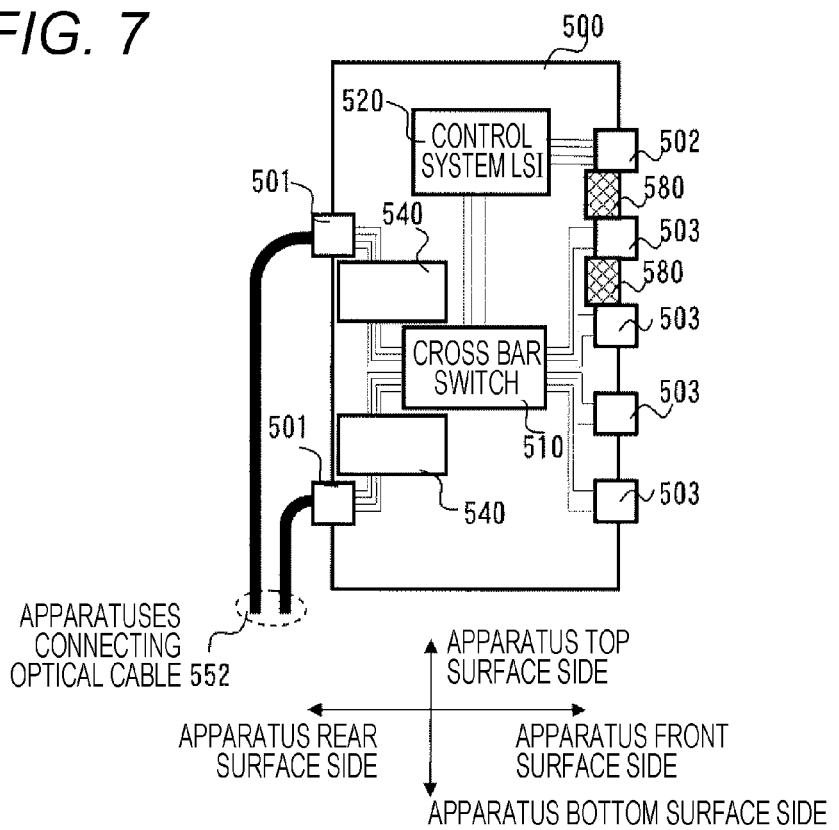
FIG. 7 is a diagram illustrating a configuration including an electric/optic conversion circuit inside a switch fabric unit according to a second modified example.

FIG. 7 is a functional configuration diagram including electric/optic conversion circuits 540 inside each switch fabric unit 500 in each of the communication apparatuses 1000 and 2000. The switch fabric unit 500 is mounted from the apparatus rear surface. The switch fabric unit 500 includes the cross bar switch 510, the control system LSI 520, and the electric/optic conversion circuits 540. The switch fabric unit 500 further includes, on the apparatus front surface side, the connector 502 for a control plane and the plurality of connectors 503 for data planes, and includes, on the apparatus rear surface side, the plurality of connectors 501 for connecting between apparatuses, and a plurality of apparatuses connecting optical cables 552.

Then, the communication apparatuses 1000 and 2000 are connected via the apparatuses connecting optical cables 552 from the connectors 501 for connecting between apparatuses that are provided on the apparatus rear surface side, thereby providing a redundant configuration.

In addition, as illustrated in FIG. 4, the cartridge 560 may be provided so as to be configured to cover the optical cables 552 connected to the switch fabric unit 500 in FIG. 7. In a case in which optical cables are used for connecting between apparatuses, this cartridge 560 prevents the optical cables from being affected by air flowing out from the exhaust openings of the FAN units 600.

Figure 8:
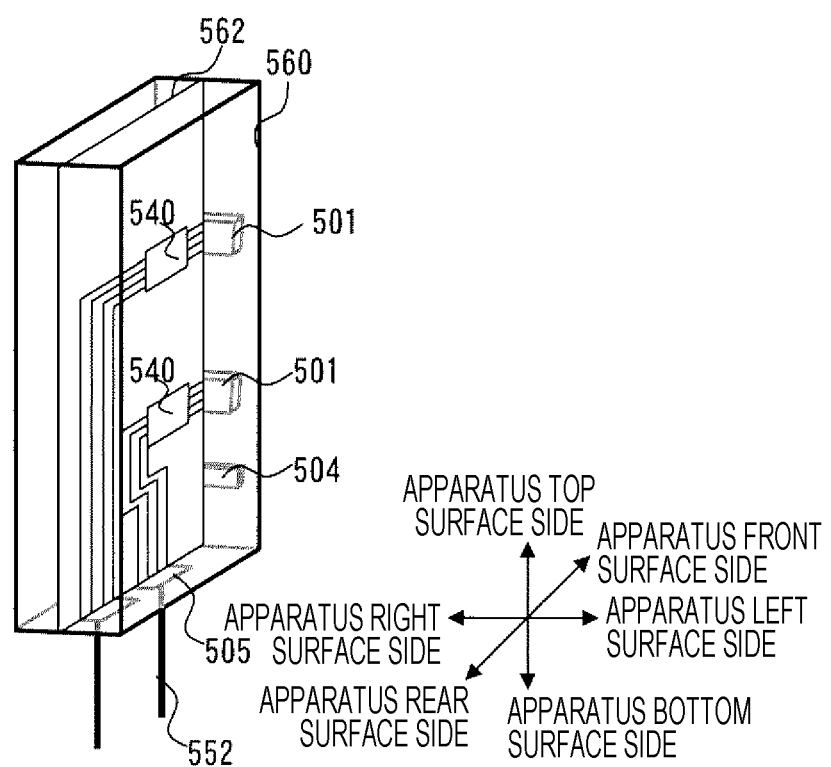
FIG. 8 is a diagram illustrating a configuration including an electric/optic conversion circuit inside a cartridge according to the second modified example.

FIG. 8 illustrates a modified example of the cartridge 560. Unlike the cartridge 560 in FIG. 5, a cartridge 560 in FIG. 8 includes a board 562. The board 562 includes connectors to the switch fabric unit, the electric-optic conversion circuits 540, and the cable connectors 505. As illustrated in FIG. 5, the cartridge 560 is connected from the apparatus rear surface, thereby establishing non-blocking connection between the two apparatuses. In addition, by providing the cartridge, swinging of the apparatuses connecting optical cable 552 due to air flowing from the exhaust openings of the FAN unit 600 can be diminished. This brings about a secondary effect of contributing to improvement in connection reliability. Also in FIG. 8, the cartridge 560 is connected to the communication apparatus side by the connectors 501. In addition, in a case in which optical cables are used for connecting between apparatuses, the cartridge 560 prevents the optical cables from being affected by air flowing out from the exhaust openings of the FAN units 600. This can diminish the prevention of optical axis misalignment, and improve reliability.

In addition, the function/performance of apparatuses connection remains the same regardless of whether the electric/optic conversion circuit 540 is mounted inside the cartridge 562, or the electric/optic conversion circuit 540 is mounted inside the switch fabric unit 500.

D. Third Modified Example

Figure 9:
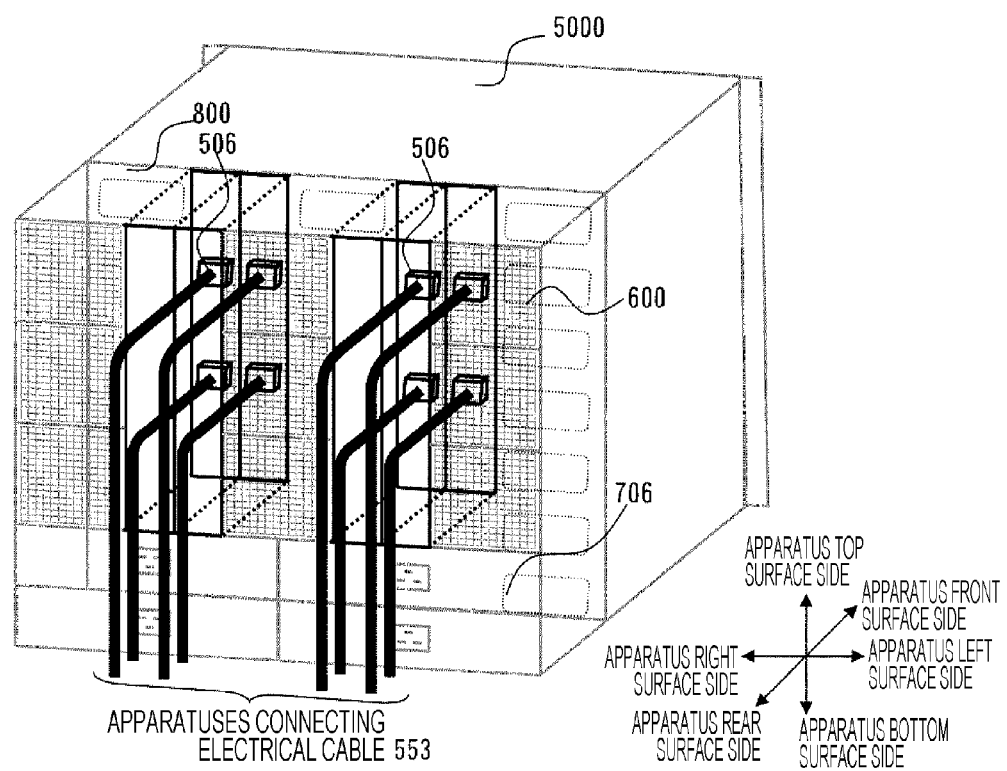
FIG. 9 is a diagram illustrating a third modified example.

FIG. 9 illustrates a communication apparatus 5000, which is a modified example of the communication apparatus 1000. The communication apparatus 5000 serves as an example of a configuration using no switch fabric unit, unlike the communication apparatuses 1000 and 2000 in FIGS. 1 and 2. FIG. illustrates an example of a non-blocking connection configuration in the communication apparatus 5000.

In such a communication apparatus 5000, a signal of a data plane is transmitted and received inside the communication apparatus 5000 between transfer engines 310 installed on a plurality of packet routing units 300, via the backplane 800. On the other hand, the signal is transmitted and received from the transfer engine 310 to another apparatus in the following manner. More specifically, apparatuses connecting ports 506 are arranged at positions on the backplane 800 where a switch fabric unit had been mounted, and non-blocking connection is established via the plurality of connectors 506 and apparatuses connecting electrical cables 553, thereby achieving the transmission and reception. In addition, in the communication apparatus 5000 in FIG. 9, the circuit board unit of the switch fabric unit 300 may be horizontally arranged on the front surface side of the communication apparatus 5000, similarly to the board unit of the data plane 250 in FIG. 2 according to a first example.

Figure 10:
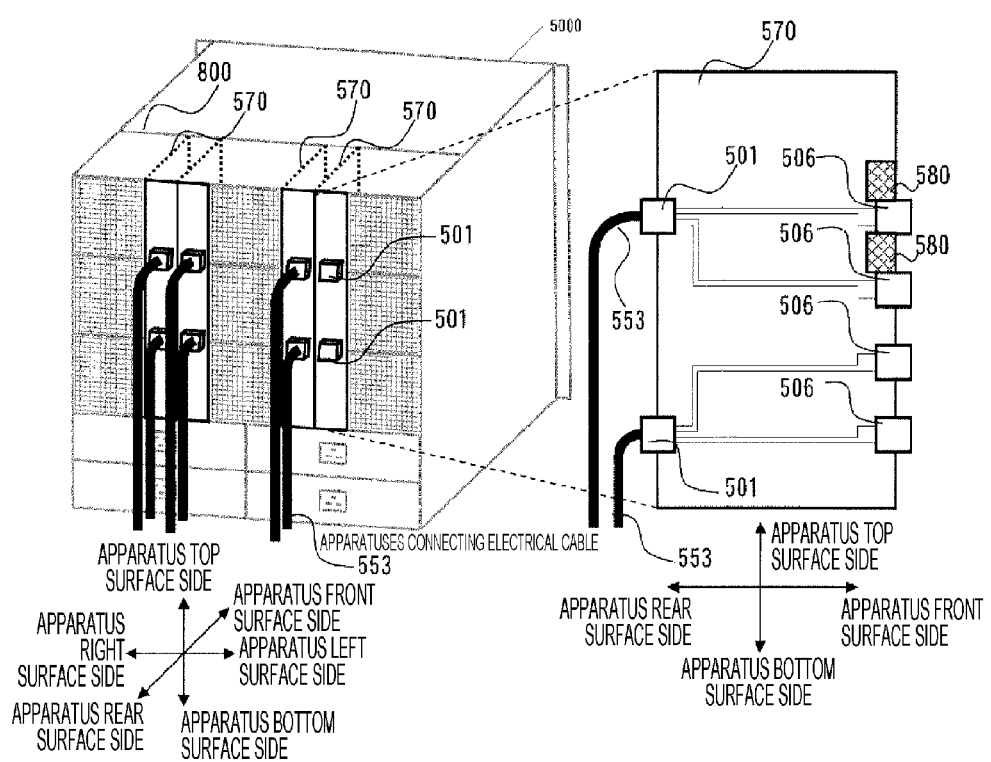
FIG. 10 is a diagram illustrating an extension board according to the third modified example.

FIG. 10 illustrates a modified example of the communication apparatus 5000 in FIG. 9. In addition, extension boards 570 for pulling out apparatuses connecting ports from the connectors 506 arranged on the apparatus rear, to the apparatus rear surface may be mounted. With this configuration, a layout work of the apparatuses connecting electrical cables 553 can be improved. The extension boards 570 are used for the purpose of pulling out the apparatuses connecting ports to a space where a detaching/attaching work of the apparatuses connecting electrical cables 553 can be performed, and thereby improving the layout work. Thus, extension cables may be adopted instead. In addition, the configuration of this third modified example may also employ a configuration for reducing the number of connected cables by mounting a speed conversion circuit, a configuration for extending a transmission distance by mounting an electric/optic conversion circuit, and a cartridge configuration. In addition, the number of the mounted extension boards 570, the number of the connectors 501 mounted on the apparatus rear surface side, and the number of the connected apparatuses connecting electrical cables 553 that are illustrated in FIG. 10 are not limited to the numbers in FIG. 10.

E. Fourth Modified Example

Figure 11:
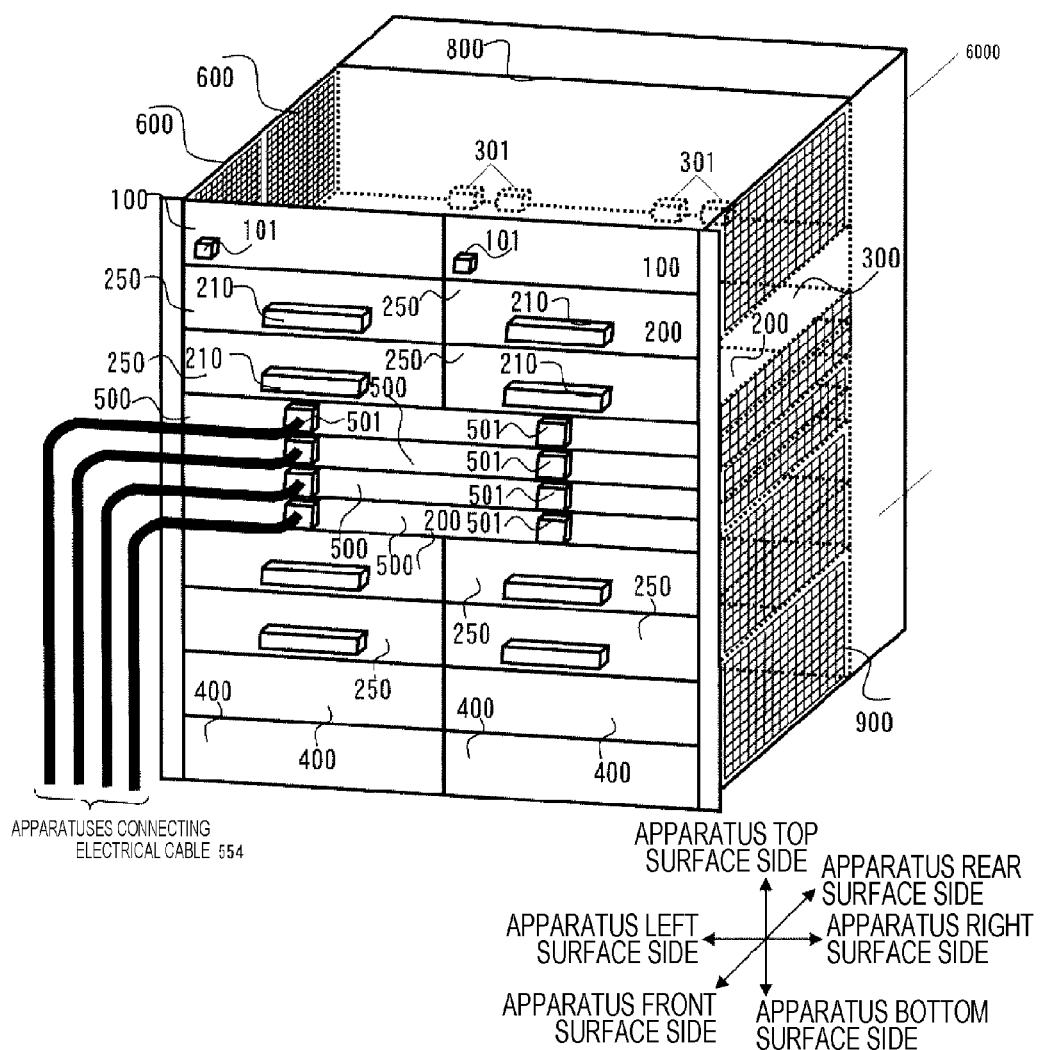
FIG. 11 is a diagram illustrating a fourth modified example.

FIG. 11 illustrates an example of a non-blocking connection configuration in a communication apparatus 6000 in which the flow of air for cooling inside the apparatus has a left-right air intake and exhaust structure, instead of the front-rear air intake and exhaust structure. On the apparatus right side surface, a ventilation opening 900 for letting therethrough cooling air for cooling components mounted on each unit is provided. Similarly, on the apparatus left side surface, the FAN units 600 and the exhaust openings for letting air therethrough are provided. In the case of the left-right air intake and exhaust structure, it is difficult to vertically mount the switch fabric units 500 as illustrated in FIGS. 2 to 10, because the flow of air is blocked. Thus, as illustrated in FIG. 11, the switch fabric units 500 are horizontally mounted on the apparatus front surface.

This configuration differs from the non-blocking connection configuration illustrated in the above-described example and modified examples in that apparatuses connecting ports are provided on the apparatus front surface. Since the switch fabric units 500 are connected to the backplane 800 by high density connectors, it is difficult to arrange apparatuses connecting ports on the apparatus rear surface. Thus, non-blocking connection between the communication apparatus and another apparatus is established via the plurality of connectors 501 and apparatuses connecting electrical cables 554 from the apparatus front surface, so that transmission and reception therebetween is achieved. With this configuration, non-blocking connection can be established even in the communication apparatus 6000 having the left-right air intake and exhaust structure. In addition, the configuration of this fourth modified example can also employ a configuration for reducing the number of connected cables by mounting a speed conversion circuit, a configuration for extending a transmission distance by mounting an electric/optic conversion circuit, and a cartridge configuration. In addition, the number of the mounted switch fabric units 500, the number of the connectors 501 mounted on the apparatus front surface side, and the number of the connected apparatuses connecting electrical cables 554 that are illustrated in FIG. 11 are not limited to the numbers in FIG. 11.

Also in the present example, the apparatuses connecting electrical cables 554 do not hamper the air exhaust by the FAN units, and the apparatuses connecting electrical cables 554 are not affected by the air exhaust to swing.

F. Fifth Modified Example

Figure 12:
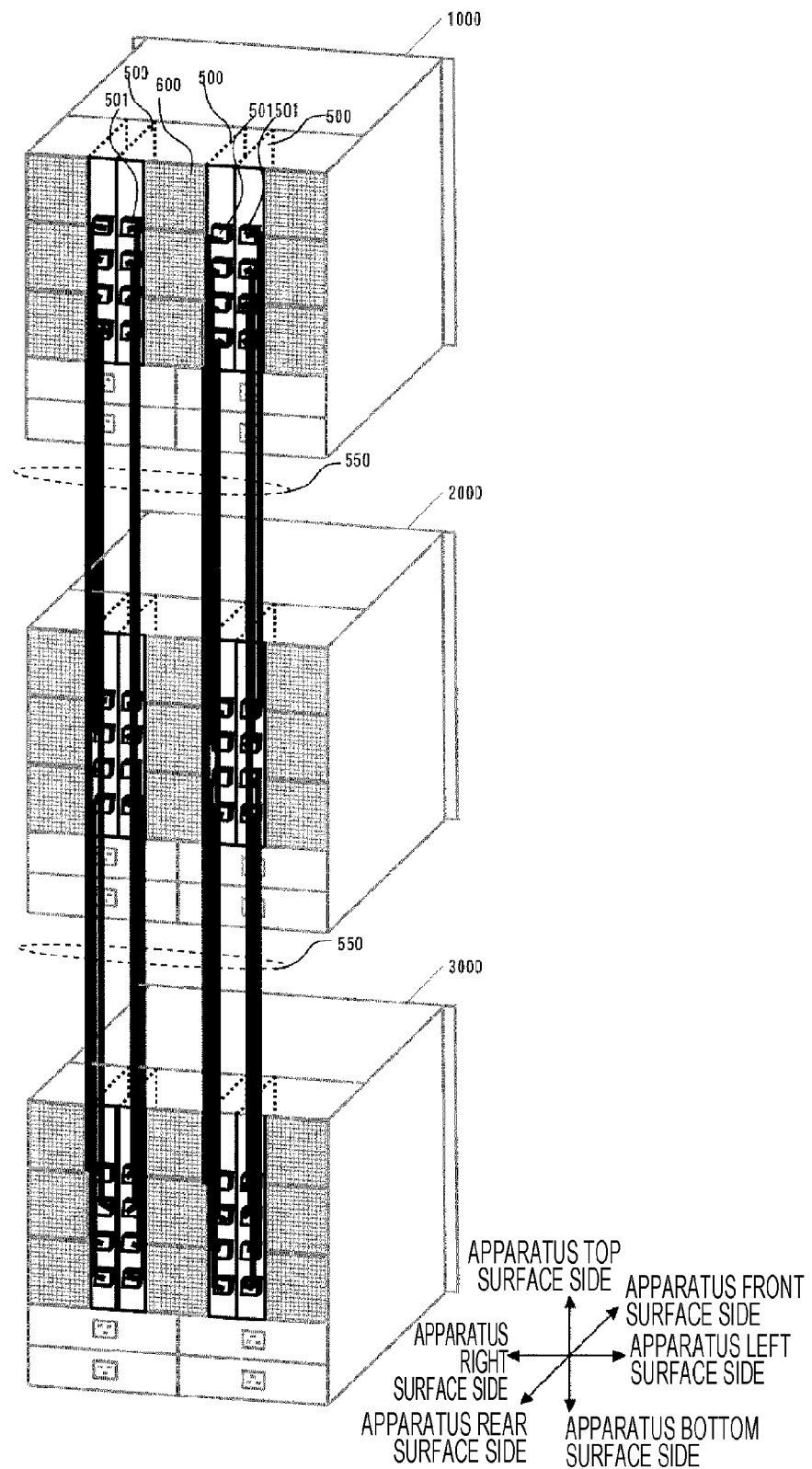
FIG. 12 is a diagram illustrating, as a fifth modified example, a redundant connection configuration of three apparatuses using the present example.

FIG. 12 illustrates an example of a non-blocking connection configuration between three apparatuses. In FIG. 12, the apparatuses connecting electrical cables 550 connect between the connectors 501 on the apparatus rear surface sides of the three apparatuses.

For example, as a connection configuration of control planes, a configuration of ring connection established between the control system repeaters 120 of respective apparatuses is employed. That is, the connection configuration desirably adopts a method of, when the communication apparatus 1000 is assumed to be an operational system apparatus, terminating at the time of return to the operational system apparatus after routing information is sequentially set in communication apparatuses 2000 and 3000 each serving as a standby system apparatus.

The data plane 250 employs a configuration of establishing non-blocking connection between its own apparatus and each of other two apparatuses. This is referred to as full mesh connection. With this configuration, non-blocking connection can be established even between three apparatuses. Furthermore, by employing a ring connection configuration for control planes and a mesh connection configuration for data planes, virtualization/redundancy of four or more apparatuses can be realized. In addition, the configuration of this fifth modified example can also employ a configuration for reducing the number of connected cables by mounting a speed conversion circuit, a configuration for extending a transmission distance by mounting an electric/optic conversion circuit, and a cartridge configuration. In addition, the number of the mounted switch fabric units 500, the number of the connectors 501 mounted on the apparatus rear surface side, and the number of the connected apparatuses connecting electrical cables 550 that are illustrated in FIG. 12 are not limited to the numbers in FIG. 12.

Also in the present example, when three communication apparatuses, i.e., an operational system apparatus and standby system apparatuses, are connected via a cable, placing the three apparatuses on a top and a bottom of a rack and vertically connecting the apparatuses via the cable reduces an installation area in a station building. In the present example, similarly to the case of installing two apparatuses as in FIG. 3, even when installing three apparatuses on a rack, the cables vertically laid out by the connectors 501 do not block the exhaust openings of the FAN units 600 of each apparatus and do not hamper air exhaust from the FAN units 600. Thus, in the present example, the flow of air flowing into and out of the apparatus is not hampered, so that cool performance does not degrade.

FIG. 13 is a diagram illustrating, by third angle projection, the communication apparatus to which the present example is applied. FIG. 13 illustrates a top view, a front view, a right side view, and a rear view of the communication apparatus 1000. As illustrated in the front view, an apparatus front surface area is occupied by the external ports 210 of network interfaces (line transmission and reception) for transmitting and receiving data for normal data relay, and the ventilation openings 900 and 950. Thus, it is difficult to secure a connection area for establishing non-blocking connection between two apparatuses. Accordingly, as illustrated in the rear view, the connection units 501 for establishing non-blocking connection between communication apparatuses are provided on the apparatus rear surface.

In the top view, the right side view, and the rear view in FIG. 13, solid lines indicate the flows of air. According to these flows, cooling air is taken into the apparatus from the ventilation openings 900 arranged on the apparatus front surface, the cooling air passes through the backplane 800 while cooling the components mounted on each unit inside the apparatus, and the air is exhausted from the FAN units 600 arranged on the apparatus rear surface. The basic control unit 100, the data plane 250, and the front power supply unit 400 that are inside the apparatus and located on this flow path are cooled. According to the flows of air indicated by these solid lines, when the air passes through the backplane 800, the air passes through the ventilation openings 850 illustrated in FIG. 2A. Thus, flow paths branching toward these ventilation openings 850 are formed, so that the air is exhausted from the apparatus rear surface.

On the other hand, in the top view, the right side view, and the rear view in FIG. 13, the flows of air indicated by broken lines will be described. First, cooling air is taken into the apparatus from the ventilation opening 950 illustrated in the front view and provided for cooling the switch fabric unit 500. When the taken cooling air reaches the switch fabric unit 500 arranged on the apparatus rear surface, since the FAN units 600 take air in, upward flow paths are formed through the board cutouts 580 illustrated in the right side view and provided on the switch fabric 500. Then, air flowing through the formed upward flow paths cools the cross bar switch 510 and the control system LSI 520. The air flowing through the flow paths passes through the board cutouts 580 to be exhausted from the apparatus rear surface from the FAN units 600. The flows of cooling air indicated by the broken lines have been described above. The flows of air indicated by the solid lines cool the basic control unit 100, the data plane 250, and the front power supply unit 400 inside the apparatus. On the other hand, the flows of air indicated by the broken lines cool modules inside the switch fabric unit 500.

In the rear view in FIG. 13, the above-described flows of air indicated by the solid lines are omitted because the flows are simple flow paths extending straight from the front surface to the rear surface. FIG. 13 only illustrates flow paths relating to the switch fabric unit 500. As illustrated in FIG. 13, the flows of air indicated by solid lines cool the basic control unit 100, the data plane 250, and the front power supply unit 400, whereas the flows of air indicated by broken lines cool different components, i.e., modules inside the switch fabric. Nevertheless, both flows of air reach the common FAN units 600 after cooling the components to be exhausted therefrom. Thus, in the apparatus according to the present example, simplification of the structure inside the apparatus, cost reduction, and miniaturization are realized.

Figure 14:
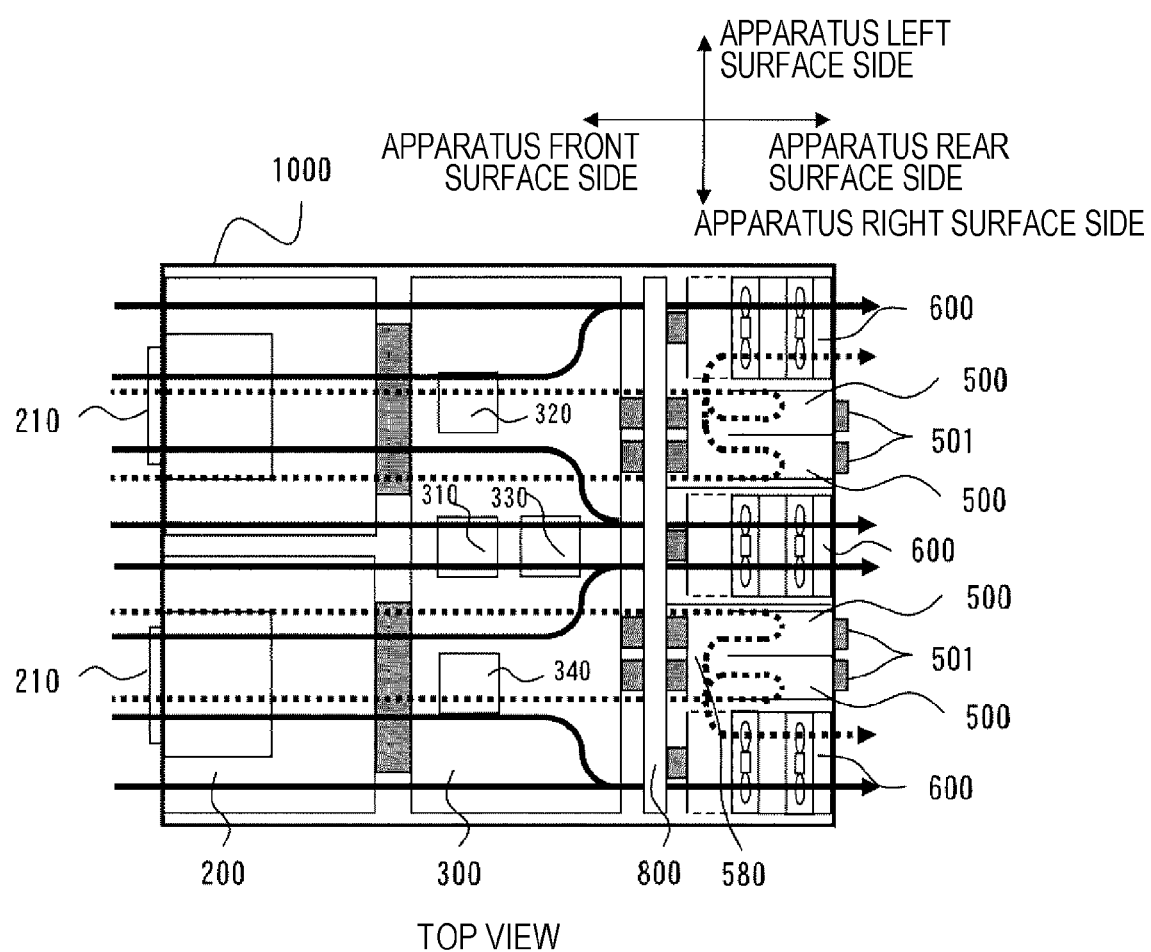
FIG. 14 is a diagram illustrating a top view in FIG. 13 in detail.

FIG. 14 is a diagram illustrating in detail the top view illustrated in FIG. 13. The flows of air indicated by solid lines indicate flow paths for the basic control unit 100, the data plane 250, and the front power supply unit 400, and the FAN units 600 on the apparatus rear surface side take air from the apparatus front surface to let the air through toward the apparatus rear surface. The flows of air indicated by broken lines can indicate the flows of air for cooling the switch fabric unit 500, similarly to those in FIG. 13. The air taken from the apparatus front surface and reaches the switch fabric unit 500 on the apparatus rear surface side has no flow path other than spaces of the board cutouts 580. Thus, the air is guided upward, and then goes toward the apparatus rear surface through the FAN units 600 of any of the left and right directions.

Figure 15:
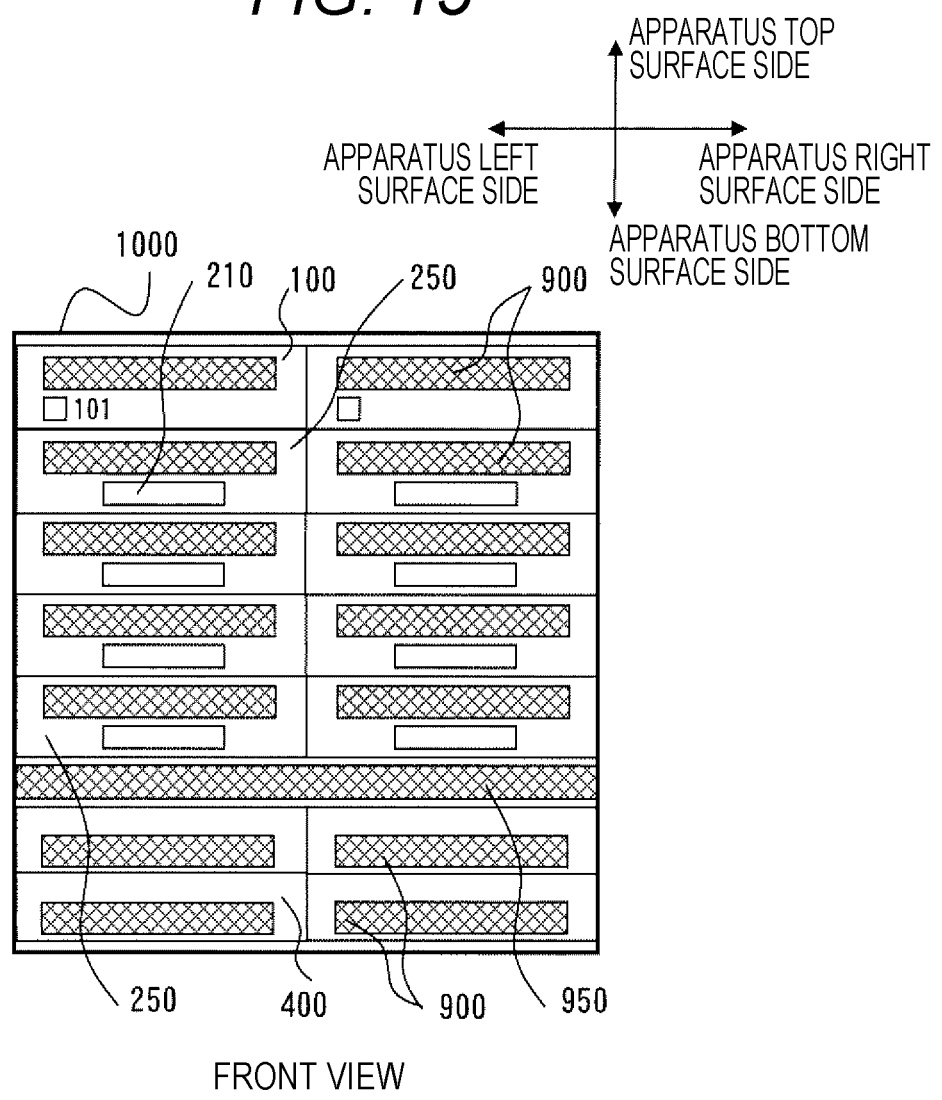
FIG. 15 is a diagram illustrating a front view in FIG. 13 in detail.

FIG. 15 is a diagram illustrating in detail the front view illustrated in FIG. 13. The ventilation openings 900 serve as ventilation openings for cooling the basic control unit 100, the data plane 250, and the front power supply unit 400. The ventilation opening 950 serves as a ventilation opening for cooling the switch fabric unit 500. By the FAN units 600 on the apparatus rear surface side, air intake through the ventilation openings 900 and 950 is performed.

Figure 16:
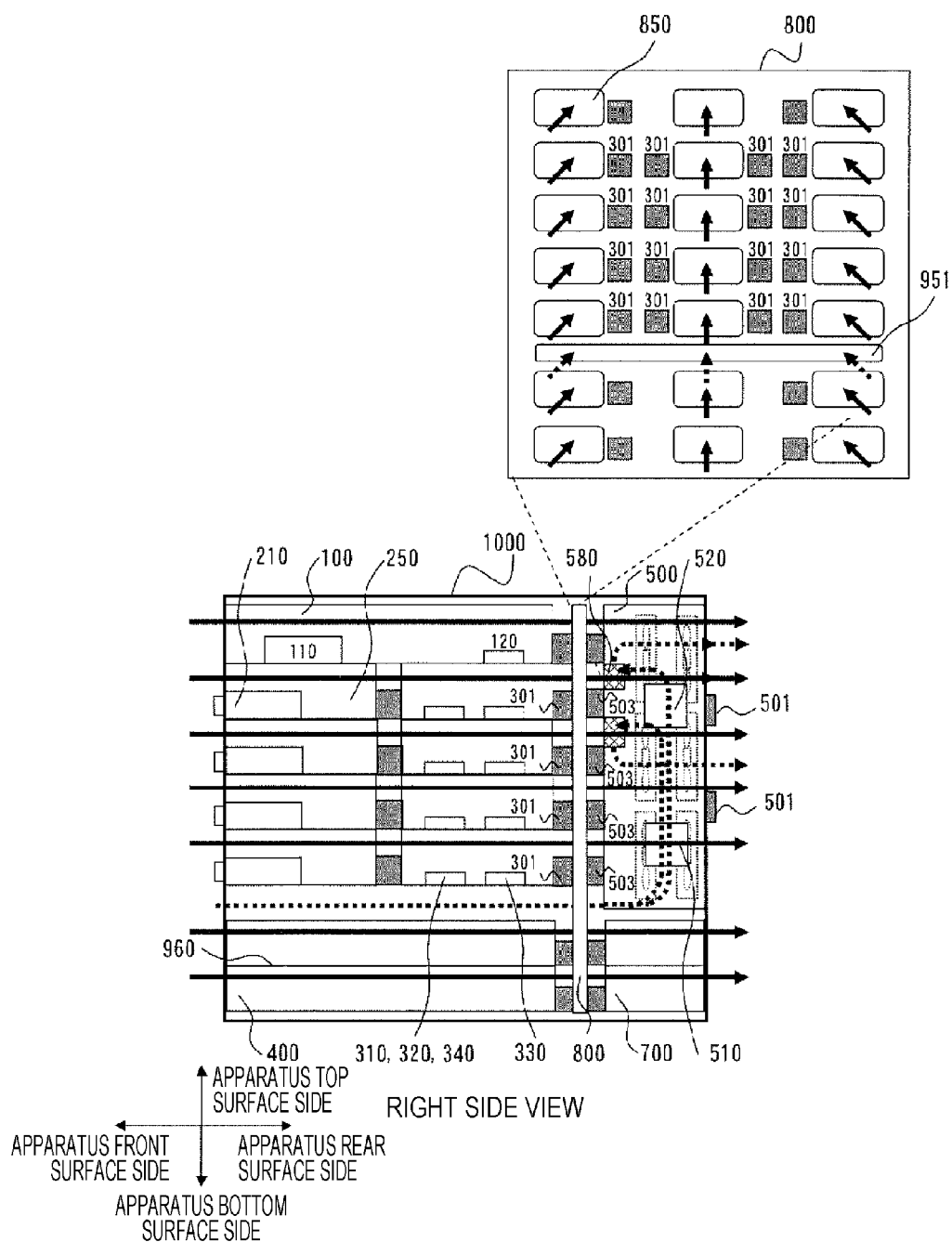
FIG. 16 is a diagram illustrating a right side view in FIG. 13 in detail.

FIG. 16 is a diagram illustrating in detail the right side view illustrated in FIG. 13. The difference between the flows of air indicated by solid lines and the flows of air indicated by broken lines is as described above with reference to FIG. 14. The air flow structure in FIG. 14 is as follows. When cooling air indicated by broken lines reaches the apparatus rear surface, since the cooling air has no flow path other than the spaces of the board cutouts 580, the cooling air is guided upward, and then goes toward the apparatus rear surface. As a result, the cross bar switch 510 and the control system LSI 520 mounted on the switch fabric unit 500 are cooled. The flows of cooling air indicated by the broken lines will be described using the backplane 800 for simplicity's sake. The cooling air for cooling the switch fabric 500 taken from the ventilation opening 950 passes through a dedicated hollow 960 and a ventilation opening 951 provided on the backplane to reach the apparatus rear surface side.

Figure 17:
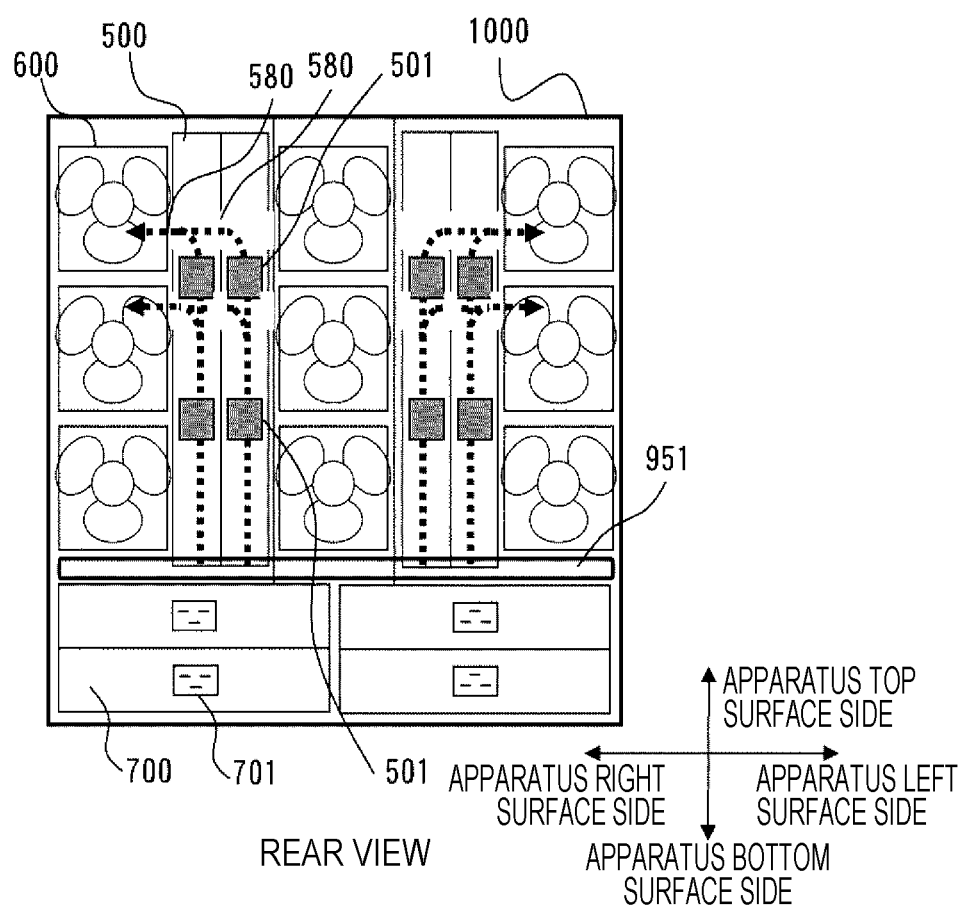
FIG. 17 is a diagram illustrating a rear view in FIG. 13 in detail.

FIG. 17 is a diagram illustrating in detail the rear view illustrated in FIG. 13. When cooling air reaches the apparatus rear surface, since the cooling air has no flow path other than the spaces of the board cutouts 580, the cooling air is guided upward, and passes through the board cutouts 580 to be guided in a transverse direction, so that the air goes toward the apparatus rear surface through the FAN units 600.

As described in the above example and modified examples, for realizing virtualization/redundancy of communication apparatuses, by establishing non-blocking connection between two apparatuses via electrical cables or optical cables, all data planes look uniform from an operational system control plane, and protocol exchange between control planes can be eliminated. This can simplify control and prevent deterioration of setting performance. In addition, since a dedicated external apparatus for switching is not required, cost increase can be suppressed. In addition, non-blocking connection can be established without decreasing the number of external ports usable by the user. In addition, due to the improvement in cable mounting density, non-blocking connection can be established while maintaining the apparatus volume.

In addition, since non-blocking connection is realized on the apparatus rear surface side, a layout work of network interface cables closely laid on the apparatus front surface is not impeded.

Furthermore, cables for connecting between apparatuses can be easily arranged in parallel to the mounting direction of a switch fabric unit, and at a position where the flow of air is not hampered. Thus, cooling performance of the apparatus is not deteriorated, and swinging of the cable due to the flow of air is prevented. As a result, the structure of contributing to the improvement in connection reliability can be achieved.

In addition, the present invention is not limited to the above example and embodiment, and can be implemented in various configurations without departing from the gist thereof. In addition, in the above example and modified examples, the description has been given of the communication system for providing a redundant configuration by communication apparatuses for relaying a packet or a frame. Nevertheless, the present invention can also be applied to a redundant configuration of a server apparatus, a storage apparatus, and the like, without departing from the gist of the present invention. More specifically, a data input/output port connected to a control unit of a server or to a storage control unit of a storage may be provided on the surface on the front surface side of a casing of an information processing apparatus of the server apparatus or the storage apparatus, and a connector connected to a cable for connecting between apparatuses may be provided on a surface different from the front surface side.

In addition, the description has been given of an example in which the FAN units 600 take air from the inside of the apparatus, and exhaust air to the outside from exhaust openings. Alternatively, the exhaust openings included in the FAN units 600 on the apparatus rear surface side may serve as intake openings. In such a case, the ventilation openings 900 and 950 on the apparatus front surface side serve as exhaust openings, and the air flows in an opposite direction to the flows of air illustrated in FIGS. 13 to 17. In addition, also in this case, the apparatuses connecting cables 550 do not hamper air intake by the FAN units 600, and swinging of the cables due to the air intake does not occur, similarly to the above-described example.

In addition, the following other configurations or application examples will be given.

A communication apparatus according to a first application example includes a basic control unit, a network interface unit, a packet routing unit, and a front power supply unit that are mounted from the apparatus front surface, and further includes a switch fabric unit, a FAN unit, and a power receiving unit that are mounted from the apparatus rear surface. Each unit is connected to the basic control unit via a backplane to be controlled. The flow of cooling air in the apparatus employs a front-rear air intake and exhaust structure. The backplane is provided with a ventilation opening for letting the cooling air therethrough. The basic control unit includes a connection unit for transmitting and receiving a control signal to and from another communication apparatus. A first connection unit to which an electrical cable can be connected by a high density connector is provided on the rear surface of the switch fabric unit. A second connection unit having the same configuration is provided on the same portion of the other communication apparatus. The first connection unit and the second connection unit are connected by electrical cables having a bandwidth equal to or greater than a total bandwidth of external ports included in the network interface unit.

In a communication apparatus according to a second application example, in the first application example, a first connection unit to which an electrical cable can be connected by a high density connector is provided on the switch fabric unit rear surface, and a second connection unit having the same configuration is provided on the same portion of the other communication apparatus. The first connection unit and the second connection unit are connected by electrical cables having an increased data rate by reducing the number of connected cables via a speed conversion circuit mounted inside the switch fabric unit, while maintaining a bandwidth equal to or greater than a total bandwidth of external ports included in the network interface unit.

In a communication apparatus according to a third application example, in the first and the second application examples, a first connection unit to which an optical cable can be connected is provided on the rear surface of the switch fabric unit, and a second connection unit having the same configuration is provided on the same portion of the other communication apparatus. The first connection unit and the second connection unit are connected by optical cables after an electric signal is converted into an optical signal via an electric/optic conversion circuit mounted inside the switch fabric unit, while maintaining a bandwidth equal to or greater than a total bandwidth of external ports included in the network interface unit.

In this manner, according the description of the first to the third application examples, non-blocking connection is also established between two apparatuses. Thus, all data planes look uniform from an operational system control plane, and protocol exchange between control planes can be eliminated. This can simplify control and prevent deterioration of setting performance.

In addition, in the application examples, at least one of the following effects is achieved: "due to the improvement in cable mounting density, non-blocking connection can be established while maintaining the apparatus volume," "since a dedicated external apparatus for switching is not required, cost increase can be suppressed, and the number of external ports usable by the user is not decreased," "since connection is established on the apparatus rear surface, interference with external ports provided on the apparatus front surface can be avoided," and "a cable for connecting between apparatuses can take a structure of not deteriorating cooling performance of the apparatus.

REFERENCE SIGNS LIST 1000, 2000, 3000, 5000, 6000 communication apparatus
100 basic control unit
101 control signal connection unit
110 CPU
120 control system repeater
250 data plane
200 network interface unit
210 external port
300 packet routing unit
301 backplane connector
310 transfer engine
320 search engine
330 local switch
340 control system LSI
400 front power supply unit
500 switch fabric unit
501, 502, 503, 504, 505, 506 connector
510 cross bar switch
520 control system LSI
530 speed conversion circuit
540 electric/optic conversion circuit
550, 551, 552, 553, 554 apparatuses connecting cable
560, 561, 562 cartridge
570 extension board
580 board cutout
600 FAN unit
700 power receiving unit
701 power cable connection unit
800 backplane
850, 900, 950, 951 ventilation opening
960 hollow

The invention claimed is:

1. A communication apparatus of an operational system for providing a redundant configuration to outside with another communication apparatus of a standby system, and for relaying data between information terminals via a network, the communication apparatus comprising:
a plurality of first circuit board units each including, on a front surface of the communication apparatus, a port for transmitting and receiving data to and from the network;
a plurality of second circuit board units each including a plurality of first connectors connected to at least one of the plurality of first circuit board units, a second connector being capable of accommodating at least a bandwidth accommodated by the plurality of first circuit board units, and being connected, via a cable, to the another communication apparatus of the standby system, and a cross bar switch for selectively outputting data to the first connectors or the second connector as a data output destination; and
a ventilation control unit for controlling a flow of air flowing between each of the first circuit board units and the second circuit board units, and the outside of the communication apparatus, wherein
the cable is arranged at a position where a flow of the air is not hampered,
the second circuit board units include the second connector arranged on a rear surface of the communication apparatus,
the first circuit board units include a first ventilation opening for passing air to and from the outside, on a same front surface side as the port,
the ventilation control unit includes, on a rear surface side of the apparatus, a fan for controlling a flow of the air, and a second ventilation opening for passing air to and from the outside of the communication apparatus,
the communication apparatus is connected, via the cable, with a communication apparatus of a standby system arranged in at least one direction of upper and lower directions of the communication apparatus in such a manner that ventilation by the second ventilation opening is not hampered, and
wherein the plurality of first circuit board units is vertically arranged on a front surface side of the communication apparatus with a third circuit board unit being interposed therebetween, and the plurality of second circuit board units is horizontally arranged on a rear surface side of the communication apparatus,
the second ventilation opening is arranged next to the plurality of second circuit board units in a horizontal direction, and
a third ventilation opening, which is different from the first ventilation opening, and forms a flow path different from a flow path of air formed between the first ventilation opening and the second ventilation opening, with the second ventilation opening, is provided on a front surface of the communication apparatus.

2. The communication apparatus according to claim 1, further comprising:
a fourth circuit board unit including a control unit for controlling the first circuit board units and the second circuit board units, on a front surface side of the communication apparatus; and
a relay circuit board unit between the control unit and the second circuit board unit, wherein
the control unit includes at least one of a packet routing unit for transferring an input packet according to routing information and a switch fabric unit, a CPU for leaning routing information, and a control system repeater, and
the second connector is arranged on a different surface from a surface on which the port is arranged, and the second circuit board units output a packet received by any of the ports, to the first connectors or the second connector according an instruction from the CPU.

3. The communication apparatus according to claim 1, wherein the second connector is connectable to an electrical cable.

4. The communication apparatus according to claim 2, wherein
the second circuit board units include a data rate conversion unit between the second connector and the cross bar switch, and
the data rate conversion unit converts a data rate of the packet to be output, into a data rate corresponding to a lane of an electrical cable.

5. The communication apparatus according to claim 1, wherein
the second circuit board unit includes a photoelectric conversion circuit for converting an electrical signal into an optical signal, between the second connector and the cross bar switch,
in a case in which a packet is output from the cross bar switch to the second connector, the packet is converted by the photoelectric conversion circuit into an optical signal, and output, via the second connector, to another communication apparatus taking a redundant configuration, and
in a case in which a packet is output from the cross bar switch to the first connectors, a packet is output from the port to a destination according to an electrical signal.

6. The communication apparatus according to claim 1, further comprising:
a cartridge including a guiding unit for connecting to another communication apparatus of a standby system in a part of a cable connected to the second connector, and a space for a connector on a side of the cable connecting to the second connector of the second circuit board unit.

7. The communication apparatus according to claim 1, wherein
the ventilation control unit causes air to flow in from the first ventilation opening on a front surface of the communication apparatus, and the FAN exhausts air inside the apparatus from a rear surface side, and
the cartridge includes a cover for preventing a cable from swinging due to air exhausted by the ventilation control unit.

8. A communication apparatus having a redundant configuration with another communication apparatus, and for relaying a packet, the communication apparatus comprising:
a plurality of first circuit board units including, on a board surface, a port for transmitting and receiving a packet to and from a network, and a packet transfer processing unit;
a second circuit board unit including a cross bar switch for controlling transmission of a packet between a plurality of first circuit board units, or transmission and reception of a packet with another communication apparatus taking a redundant configuration, and a plurality of connectors being capable of communicating with the another communication apparatus, being capable of accommodating at least a bandwidth accommodated by the port included in the communication apparatus, and being arranged on a rear surface side of the apparatus;
a third circuit board unit arranged vertical to a first circuit board unit on a front surface side of a casing of the communication apparatus and to a second circuit board unit on a rear surface side; and
an air exhaust control unit being arranged on a rear surface side of the communication apparatus, next to the third circuit board unit in a horizontal direction, and exhausting air inside the apparatus, wherein
the plurality of first circuit board units is provided with a first ventilation opening on a same front surface side as the port,
a second ventilation opening is provided on the rear surface side,
second ventilation openings are provided on front surfaces of casings of both apparatus in a region different from the first circuit board unit,
the air exhaust control unit further includes, on a rear surface side of the apparatus, a FAN for controlling flows of air between the first ventilation opening and the second ventilation opening, and between a third ventilation opening and a second ventilation opening, and
wherein the second circuit board unit includes, between the connectors and the cross bar switch, a data rate conversion unit for increasing a data rate of data flowing to the connectors.

9. The communication apparatus according to claim 8, wherein
the second circuit board unit arranges a photoelectric conversion circuit for converting an electrical signal into an optical signal, between the connectors and the cross bar switch, converts a packet from the cross bar switch into an optical signal, and transmits the packet to the another communication apparatus via an optical cable, and
in a case in which a packet is output from the cross bar switch to any of the plurality of first circuit board units, the packet is further output to a destination of the packet via the port.

* * * * *